United States Patent
Zhao et al.

(10) Patent No.: US 11,164,600 B1
(45) Date of Patent: Nov. 2, 2021

(54) METHODS OF FORMING MATERIALS

(71) Applicant: SEAGATE TECHNOLOGY LLC, Cupertino, CA (US)

(72) Inventors: Tong Zhao, Eden Prairie, MN (US); Michael C. Kautzky, Eagan, MN (US); Lance Nevala, Chanhassen, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/551,085

(22) Filed: Aug. 26, 2019

Related U.S. Application Data

(63) Continuation-in-part of application No. 15/687,500, filed on Aug. 27, 2017, now abandoned.

(60) Provisional application No. 62/380,024, filed on Aug. 26, 2016.

(51) Int. Cl.
| | | |
|---|---|---|
| *G11B 5/31* | (2006.01) | |
| *G11B 5/147* | (2006.01) | |
| *G11B 5/00* | (2006.01) | |
| *G11B 13/08* | (2006.01) | |
| *C30B 19/08* | (2006.01) | |
| *C30B 29/08* | (2006.01) | |
| *C30B 29/02* | (2006.01) | |

(52) U.S. Cl.
CPC ............ *G11B 5/3163* (2013.01); *C30B 19/08* (2013.01); *C30B 29/02* (2013.01); *G11B 5/147* (2013.01); *G11B 13/08* (2013.01); *G11B 2005/0021* (2013.01)

(58) Field of Classification Search
CPC ....... G11B 5/3163; G11B 5/147; G11B 13/08; C30B 19/08; C30B 29/02
See application file for complete search history.

(56) References Cited

U.S. PATENT DOCUMENTS

| | | |
|---|---|---|
| 3,906,791 A | 9/1975 | Lynnworth |
| 5,472,777 A | 12/1995 | Kineri |
| 6,738,141 B1 | 5/2004 | Thirstrup |
| 7,419,912 B2 | 9/2008 | Donofrio |
| 7,759,609 B2 | 7/2010 | Asscher |
| 8,514,673 B1 * | 8/2013 | Zhao ................... G11B 13/08 369/13.33 |
| 8,897,105 B1 | 11/2014 | Zuckerman |
| 9,129,626 B2 | 9/2015 | Kautzky |
| 2005/0189329 A1 | 9/2005 | Talwar |
| 2007/0012950 A1 | 1/2007 | Cain |

(Continued)

OTHER PUBLICATIONS

Chen et al., "Drude Relaxation Rate in Grained Gold Nanoantennas," *Nano Letters*, 2010, 10, 916-922.

(Continued)

*Primary Examiner* — Michael P Wieczorek
(74) *Attorney, Agent, or Firm* — Mueting Raasch Group

(57) ABSTRACT

Methods of forming a near field transducer (NFT), the methods including the steps of depositing plasmonic material on a substrate; laser annealing at least a portion of the deposited plasmonic material at a wavelength from 100 nm to 2.0 micrometers (μm) to induce liquid phase epitaxy (LPE) in the annealed deposited plasmonic material to form a epitaxially modified plasmonic material; and forming a NFT from at least a portion of the epitaxially modified plasmonic material are disclosed as well as other methods and devices such as those formed.

7 Claims, 7 Drawing Sheets

(56) References Cited

U.S. PATENT DOCUMENTS

| | | | |
|---|---|---|---|
| 2007/0019028 A1 | 1/2007 | Renn | |
| 2007/0207335 A1 | 9/2007 | Karandikar | |
| 2008/0056080 A1 | 3/2008 | Milster | |
| 2010/0123965 A1 | 5/2010 | Lee | |
| 2010/0214685 A1 | 8/2010 | Seigler | |
| 2011/0044857 A1 | 2/2011 | Lin | |
| 2011/0205863 A1 | 8/2011 | Zhao | |
| 2011/0286127 A1 | 11/2011 | Gao | |
| 2012/0039155 A1 | 2/2012 | Peng | |
| 2012/0138937 A1 | 6/2012 | Jo | |
| 2013/0276877 A1 | 10/2013 | Dionne | |
| 2013/0279035 A1 | 10/2013 | Peng | |
| 2014/0302255 A1 | 10/2014 | Spicer | |
| 2014/0376346 A1 | 12/2014 | Sahoo | |
| 2014/0376352 A1* | 12/2014 | Cheng | C22C 27/025 369/13.33 |
| 2015/0132503 A1* | 5/2015 | Kautzky | G11B 7/22 427/554 |

OTHER PUBLICATIONS

Chen et al., "Enhanced Thermal Stability of Silica-Coated Gold Nanorods for Photoacoustic Imaging and Image-Guided Therapy," *Optics Express*, Apr. 26, 2010, vol. 18, No. 9.

Feng et al., "Prediction of Size Effect on Thermal Conductivity of Nanoscale Metallic Films," *Thin Solid Films*, 517 (2009), 2803-2807.

Greer et al., "Nanoscale Gold Pillars Strengthened Through Dislocation Starvation," *Physical Review*, B 73, 245410 (2006).

Hau-Riege et al., "Simulation of Microstructural Evolution Induced by Scanned Laser Annealing of Metallic Interconnects," *Journal of Electronic Materials*, vol. 30, No. 1, 2001.

Huang et al., "Universal and Non-Universal Aspects of Wet Granular Matter Under Vertical Vibrations," *Eur. Phys. J. Special Topics*, 179, 25-32 (2009).

Huang, "Pulsed Laser Photothermal Annealing and Ablation of Plasmonic Nanoparticles", *European Physical Journal Special Topics*, 2008, 153, 223-230.

Lerner et al., editor; Encyclopedia of Physics, Second Edition; excerpt by Chang et al., "Plasmons" on pp. 936-937, VCH Publishers, Inc., New York, NY; 1991 (no month).

Matsumura et al., "Advanced Excimer-Laser Annealing Process for Quasi Single-Crystal Silicon Thin-Film Devices," *Thin Solid Films*, 337, (1999), 123-128.

Rost et al., "Grains, Growth and Grooving", *Physical Review Letters*, vol. 91, No. 2, Jul. 11, 2003.

\* cited by examiner

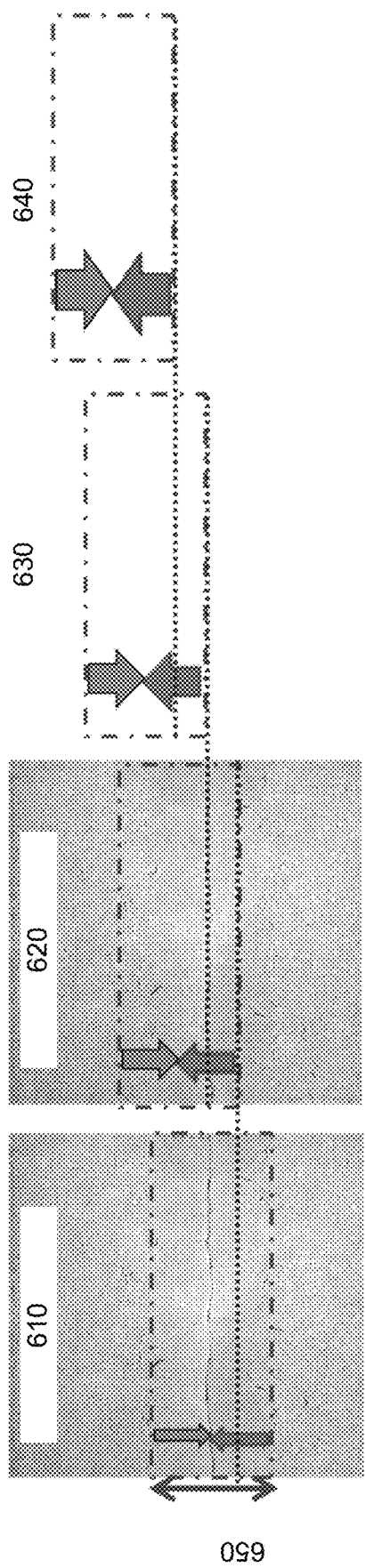
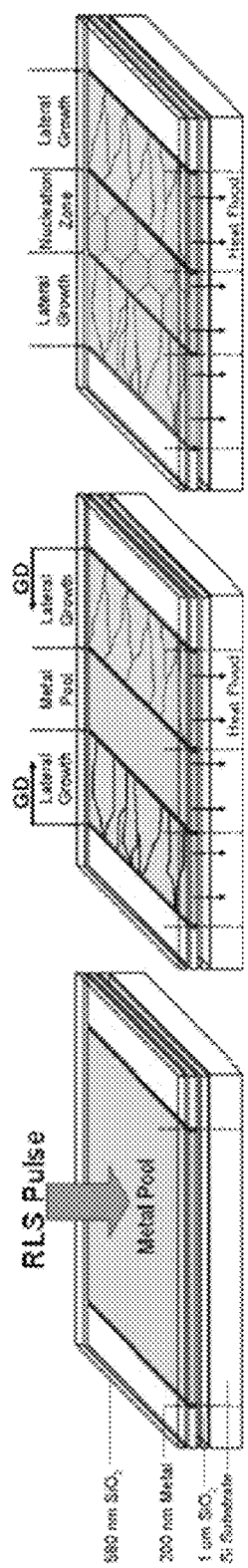
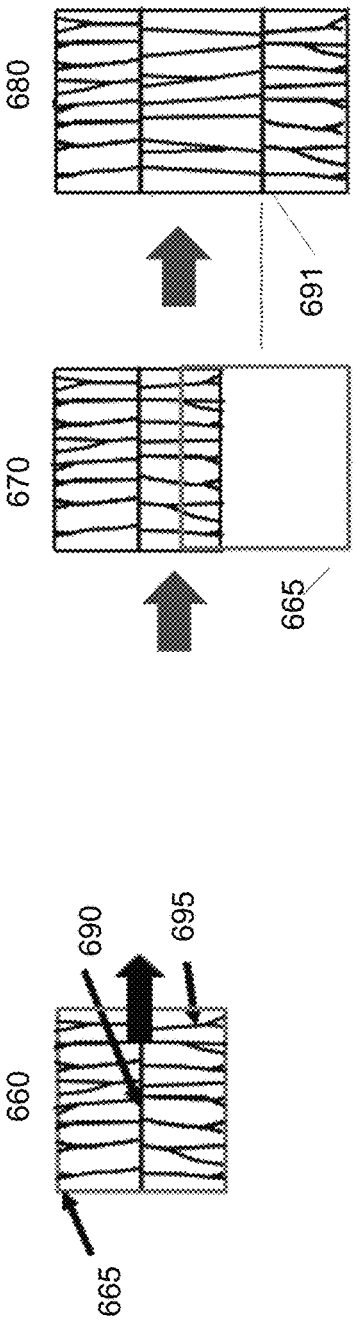
FIG. 6A
FIG. 6B
FIG. 6C

METHODS OF FORMING MATERIALS

PRIORITY

This application is a continuation-in-part of U.S. application Ser. No. 15/687,500, filed on Aug. 27, 2017 and which claims priority to U.S. Provisional Applications No. 62/380,024 entitled METHODS OF FORMING MATERIALS, filed on Aug. 26, 2016, the disclosure of which is incorporated herein by reference thereto.

SUMMARY

Disclosed herein are methods of forming a near field transducer (NFT), the methods including the steps of: depositing plasmonic material on a substrate; laser annealing at least a portion of the deposited plasmonic material to induce liquid phase epitaxy (LPE) in the annealed deposited plasmonic material to form a epitaxially modified plasmonic material; and forming a NFT from at least a portion of the epitaxially modified plasmonic material.

Also disclosed herein are methods of forming a near field transducer (NFT), the methods including the steps of: forming a mold on a substrate, the mold comprising tungsten (W), tantalum (Ta), titanium (Ti), platinum (Pt), palladium (Pd), ruthenium (Ru), iridium (Ir), carbon (C), oxides, nitrides, carbides, or borides, combinations thereof; depositing a plasmonic material on at least a portion of the mold; laser annealing at least a portion of the deposited plasmonic material to induce liquid phase epitaxy (LPE) in the annealed deposited plasmonic material to form a epitaxially modified plasmonic material, wherein the mold controls at least the in-plane gradient in the plasmonic material; and forming a NFT from at least a portion of the epitaxially modified plasmonic material.

Devices formed using disclosed methods are also included herewith.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 6A, 6B and 6C schematically depict the effect of more than one shot or pulse from a laser.

FIGS. 9A, 9B, and 9C show the results of a first horizontal scan (FIG. 9A) followed by a second vertical scan (FIG. 9B); and a static laser shot with four exposures with orthogonal openings for the sake of comparison, while

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
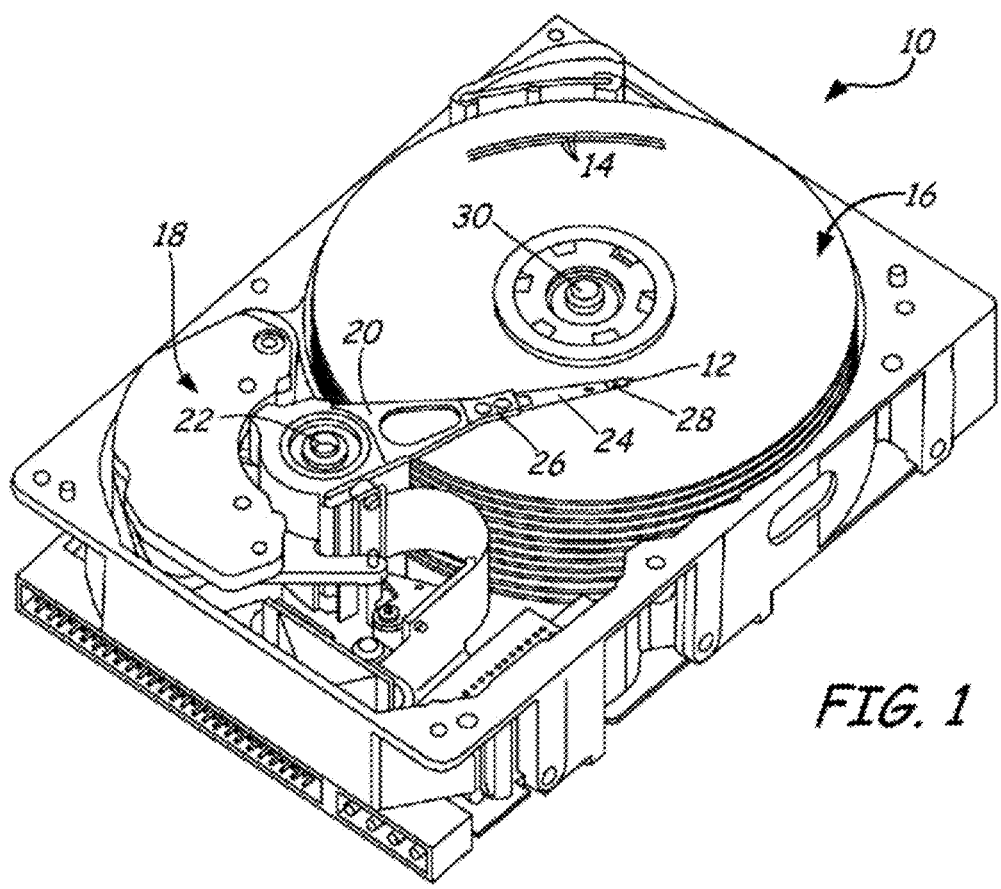
FIG. 1 is a perspective view of a magnetic disc drive that can include HAMR devices.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive.

Fabrication of almost all semiconductor and electronic devices include steps of depositing thin films. Thin films deposited by conventional thin film deposition techniques, for example physical vapor deposition (PVD), chemical vapor deposition (CVD), atomic layer deposition (ALD), electroplating and evaporative techniques, can result in metastable microstructures, or physical structures are non-optimum for some devices. This can result in undesired material properties, as well as material instability and detrimental physical microstructure changes over time. Moreover, changes in film microstructure, or properties or both can be accelerated when the film is stressed (as might happen when devices that are fabricated out of the material are subject to actual operating conditions, which may include elevated physical stresses and elevated temperatures).

Heat treating the material in a prescribed manner (time/temp/ambient/condition) is a common practice to drive to a desired low energy/stable microstructure (and hence material/stable microstructure properties). During Heat Treatment, the ability to grow grains sized larger than the device may be desired, in order to allow fabrication (when advantageous for reliability or device performance considerations) of working devices out of single crystal material.

However, in microelectronic or MEMS devices the ability to implement conventional heat treatments is often limited due to the detrimental effect of the treatment temperature on adjacent film stacks/devices. A wafer level spike anneal (such as traditional rapid thermal anneal (RTA)) can be implemented, but can include side effects such as stress, within wafer temperature management, and repeatability issues (resulting in wafer warpage/film delamination/etc.) that limit applicability.

Therefore, a true localized 'spot' anneal may be useful to obtain annealing temperatures while at the same time having a minimum impact (stress/temperature/etc.) to the overall system or device in which the structure exists. "Spot" annealing can be accomplished by laser annealing. Laser annealing, accomplished with an excimer laser may also be referred to as excimer laser annealing (ELA).

In addition, traditional material engineering techniques in addition to heat treating (cold working, dispersion hardening, etc.) possible in bulk film systems are also not easily implemented in thin film systems. In particular introduction of 'dopant' alloying materials to stabilize grain microstructure is problematic in thin film (particularly metal) systems. Challenges include producing material w/sufficiently low enough dopant concentrations (to minimize impact to bulk electrical properties, etc.) and proper/uniform dispersion/inclusion into microstructure.

Traditional thin film deposition (in the case of PVD based depositions, in part due to both target sputter rate differences and sticking coefficients/adsorption rate differences between the alloying material and the bulk material on the wafer substrate itself) and implant in combination with traditional anneal solutions (not able to uniformly disperse in material) are unsatisfactory in this regard. Electroplating w/dopants inclusion in combination with traditional annealing is also challenging.

In addition, in a significant amount of cases the proper microstructure can only be set up when the dopant is added in the melt, as the desired microstructure is derived from the proper solidification 'schedule' from the liquid/melt phase (when the alloying element is present).

Disclosed herein therefore are methods of forming materials that include the use of or a step of liquid phase epitaxy (LPE). LPE can also be referred to as rapid lateral solidification or sequential lateral solidification. LPE is a method to grow crystal layers from a melt on a solid substrate. Thin film melting points are often lower than melting points of a bulk. The semiconductor is dissolved in the melt of another material. At conditions that are close to the equilibrium between dissolution and deposition, the deposition of the semiconductor crystal on the substrate is relatively fast and uniform. The most used substrate is indium phosphide (InP). Other substrates like glass or ceramic can be applied for special applications. To facilitate nucleation and to avoid tension in the grown layer the thermal expansion coefficient of substrate and grown layer should be similar.

A laser anneal can be utilized to form the melt and as such the laser anneal step can be referred to as a LPE laser anneal step. Disclosed methods can be utilized to form various devices. In some embodiments, disclosed methods can be utilized to form a near field transducer (NFT) that can be part of a magnetic memory device.

FIG. 1 is a perspective view of disc drive 10 including an actuation system for positioning slider 12 over track 14 of magnetic medium 16. The particular configuration of disc drive 10 is shown for ease of description and is not intended to limit the scope of the present disclosure in any way. Disc drive 10 includes voice coil motor 18 arranged to rotate actuator arm 20 on a spindle around axis 22. Load beam 24 is connected to actuator arm 20 at head mounting block 26.

Suspension 28 is connected to an end of load beam 24 and slider 12 is attached to suspension 28. Magnetic medium 16 rotates around an axis 30, so that the windage is encountered by slider 12 to keep it aloft a small distance above the surface of magnetic medium 16. Each track 14 of magnetic medium 16 is formatted with an array of data storage cells for storing data. Slider 12 carries a magnetic device or transducer (not shown in FIG. 1) for reading and/or writing data on tracks 14 of magnetic medium 16. The magnetic transducer utilizes additional electromagnetic energy to heat the surface of medium 16 to facilitate recording by a process termed heat assisted magnetic recording (HAMR).

Figure 2:
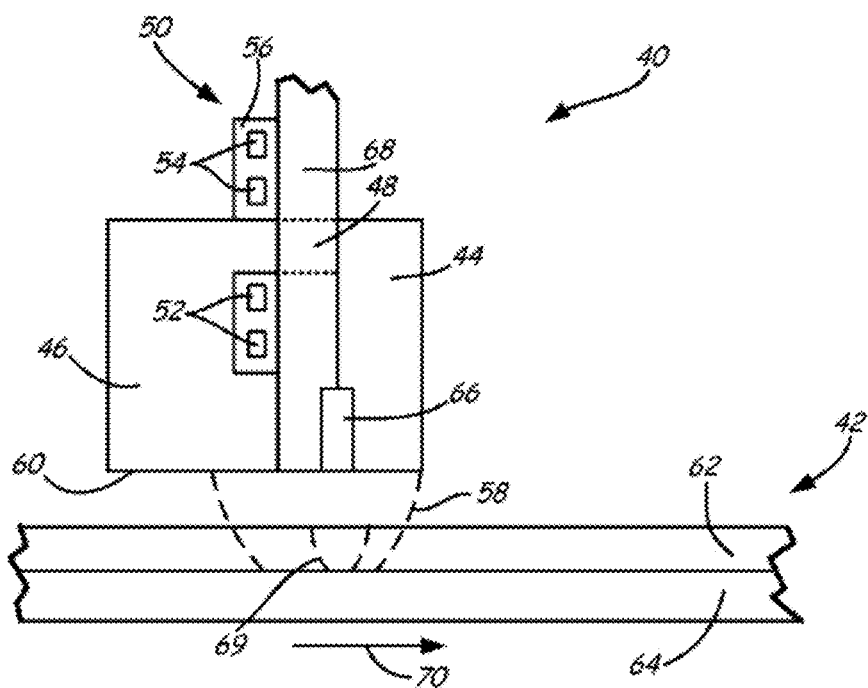
FIG. 2 is a cross sectional view of a perpendicular HAMR magnetic recording head and of an associated recording medium.

A HAMR transducer includes a magnetic writer for generating a magnetic field to write to a magnetic medium (e.g. magnetic medium 16) and an optical device to heat a portion of the magnetic medium proximate to the write field. FIG. 2 is a cross sectional view of a portion of a magnetic device, for example a HAMR magnetic device 40 and a portion of associated magnetic storage medium 42. HAMR magnetic device 40 includes write pole 44 and return pole 46 coupled by pedestal 48. Coil 50 comprising conductors 52 and 54 encircles the pedestal and is supported by an insulator 56. As shown, magnetic storage medium 42 is a perpendicular magnetic medium comprising magnetically hard storage layer 62 and soft magnetic underlayer 64 but can be other forms of media, such as patterned media. A current in the coil induces a magnetic field in the pedestal and the poles. Magnetic flux 58 exits the recording head at air bearing surface (ABS) 60 and is used to change the magnetization of portions of magnetically hard layer 62 of storage medium 42 enclosed within region 58. Near field transducer 66 is positioned adjacent the write pole 44 proximate air bearing surface 60. Near field transducer 66 is coupled to waveguide 68 that receives an electromagnetic wave from an energy source such as a laser. An electric field at the end of near field transducer 66 is used to heat a portion 69 of magnetically hard layer 62 to lower the coercivity so that the magnetic field from the write pole can affect the magnetization of the storage medium.

Devices disclosed herein can also include other structures. Devices disclosed herein can be incorporated into larger devices. For example, sliders can include devices as disclosed herein. Exemplary sliders can include a slider body that has a leading edge, a trailing edge, and an air bearing surface. The write pole, read pole, optical near field transducer and contact pad (and optional heat sink) can then be located on (or in) the slider body. Such exemplary sliders can be attached to a suspension which can be incorporated into a disc drive for example. It should also be noted that disclosed devices can be utilized in systems other than disc drives such as that depicted in FIG. 1.

Figure 3:
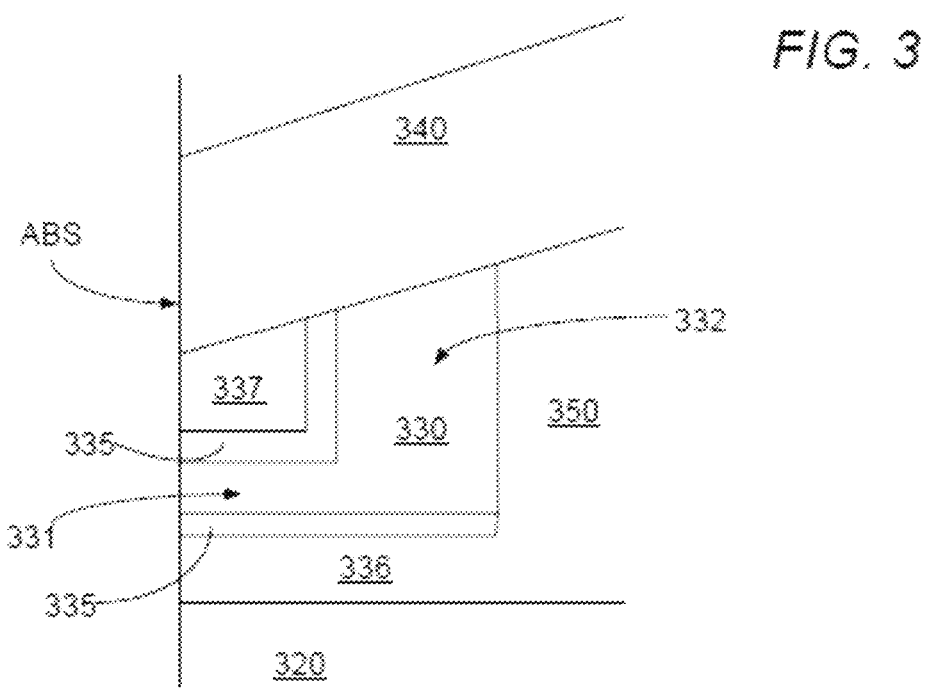
FIG. 3 is a cross sectional view of the NFT and surrounding structures.

FIG. 3 shows a cross section of a device taken perpendicular to the air bearing surface (ABS). The device includes a write pole 340, a waveguide core 320, optical cladding 350 and a NFT 330. The portion of the cladding between the core 320 and the NFT 330 is depicted by numeral 336 and can be referred to as the core to NFT space, or CNS. The portion of the cladding between the pole 340 and the NFT 330 is depicted by numeral 337 and can be referred to as the pole to NFT space, or NPS. Between the NFT 330 and the optical cladding 350 is an illustrative and optional adhesion layer 335. In some embodiments, the optional adhesion layer 335 can be located on different surfaces of the NFT 330 than that shown in the cross section of FIG. 3. One of skill in the art, having read this specification will understand that NFT types other than peg and disk (also referred to as "lollipop" type NFTs) could be utilized herein. For example plasmonic gap type NFTs and peg only NFTs can also be utilized.

Disclosed herein are methods of forming at least a portion of a near field transducers (NFTs) that utilize liquid phase epitaxy through laser annealing. Disclosed methods can advantageously form portions of NFTs, for example a peg in a peg/disc type of NFT, that include less grains of plasmonic material and in some embodiments a peg that includes a single grain of plasmonic material. Single grains of plasmonic materials in a peg can be advantageous for a number of reasons. First, single grain pegs will be less susceptible to grain growth and densification when exposed to high temperatures. Second, single grain pegs may provide enhancements in the strength of the peg material. Third, single grain pegs may provide improved thermal conductivity which ultimately leads to greater temperature reductions. Fourth, single grain pegs may provide an improved electron scattering rate and longer surface plasmon polaritron (SPP) propagation length. Laser annealing can also advantageously be used to improve the density of the NFT material. Denser materials may be useful for a number of applications. Denser materials can be measured through observation of slower mill rates, thickness reduction after laser annealing, other secondary indicia, or combinations thereof. Material density improvements can also provide enhanced robustness against thermally-driven failure modes of the NFT during operation.

Likely dimensions of a NFT can indicate an average grain size that could be utilized to create a "single grain" peg. In some embodiments where a peg (that is part of a disc and peg NFT) has a 20 to 40 nanometer (nm) width, a 20 nm air bearing surface (ABS) to disc length, and a 145 nm total peg length (along the same direction), calculations based on a two dimensional array of square grains would indicate that, although grain boundaries can't statistically be eliminated, an average grain size of at least 400 nm to 500 nm should minimize grain boundaries in the peg. In some embodiments where the peg has a total length of 60 nm (as opposed to 145 nm in the example above), an average grain size of at least 300 nm should minimize, but can't statistically be eliminated, grain boundaries in the peg. An illustrative example of full three dimensional dimensions of a NFT peg are width (20 to 40 nm), height (20 to 40 nm) and total length (145 nm).

Methods disclosed herein utilize laser annealing to provide localized surface heating to induce grain growth through liquid phase epitaxy, for example, of the material of the NFT (e.g., plasmonic material). Disclosed methods generally include a step of depositing a plasmonic material and laser annealing the plasmonic material to induce liquid phase epitaxy. The laser anneal can occur at different stages of manufacture. For example, the laser annealing can occur before any structural processing has been done to the plasmonic material or after one or more structural processing steps. In some embodiments, a film or a sheet film of a plasmonic material (at the wafer level of processing) can be laser annealed and then that liquid phase epitaxy formed or modified material can be patterned into a peg. In some embodiments, plasmonic material that has already been patterned into a peg (at the wafer level of processing) can be laser annealed and then that liquid phase epitaxy formed or modified material can be further processed into a NFT. In some embodiments, plasmonic material that has already been patterned into a peg and further processed into a NFT, for example an encapsulated peg (at the wafer level of processing) can be laser annealed to affect liquid phase epitaxy formed or modified material.

Figure 4:
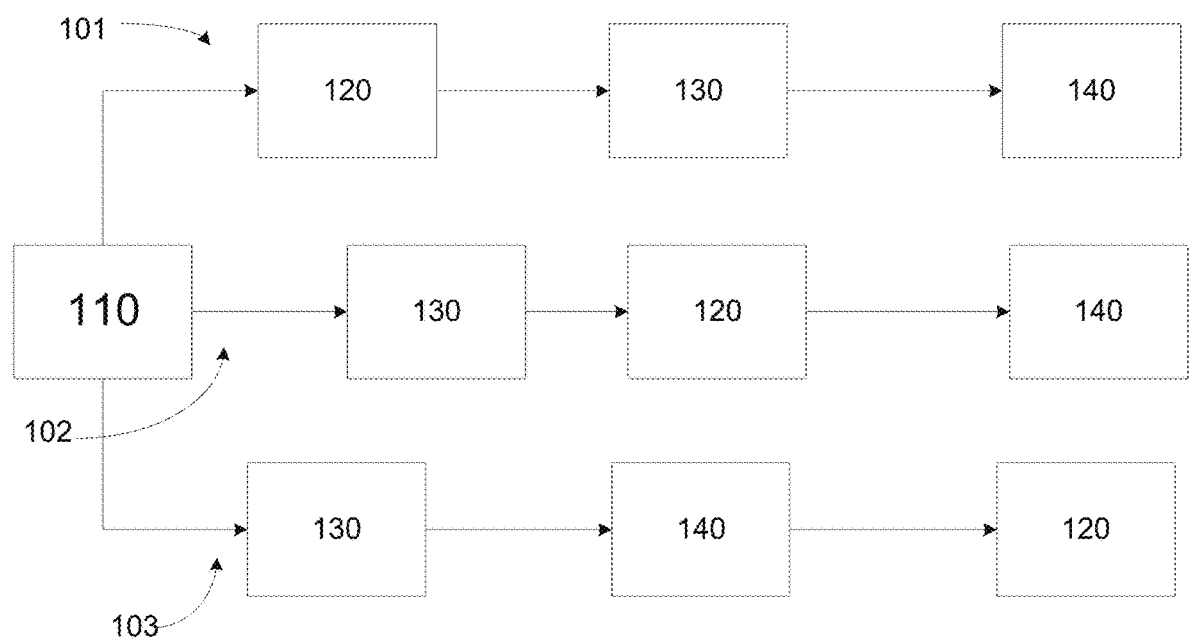
FIG. 4 presents flow diagrams for various disclosed methods.

FIG. 4 presents flow diagrams for various disclosed methods. All of the methods disclosed therein begin with step 110, depositing plasmonic material. The step of depositing the plasmonic material can utilize known methods of materials deposition including physical vapor deposition (PVD), chemical vapor deposition (CVD), metallorganic chemical vapor deposition (MOCVD), Ion-beam deposition (IBD), evaporation and electrodeposition for example. The plasmonic material can be any material that has plasmonic properties and is desired to be a NFT within the device. Exemplary plasmonic materials can include, for example gold (Au), silver (Ag), aluminum (Al), copper (Cu), rhodium (Rh), iridium (Ir), and alloys thereof.

All of the methods include a step 120 of laser annealing. Generally, laser annealing refers to the use of a laser to expose a material to radiation to heat the material. In the context of disclosed methods, laser annealing refers to the use of a laser to expose the deposited plasmonic material or in some embodiments a portion of the deposited plasmonic material to radiation in order to heat the material to induce liquid phase epitaxial growth.

Laser annealing can be accomplished using lasers that emit energy at any wavelength or wavelengths. Any type of laser can be utilized, examples include helium neon (HeNe) lasers, solid state lasers (e.g. YAG, etc), gas lasers (e.g. $CO_2$, etc.) and excimer lasers. Selection of the particular wavelength or wavelengths to utilize can be based at least in part on the material being annealed. Most plasmonic materials have relatively low reflectivity (therefore relatively high absorption) at wavelengths not greater than 600 nanometers (nm), for example. Therefore, such wavelengths may be useful for laser annealing. However, some plasmonic materials, platinum (Pt) for example have some level of absorption all the way out to 2.0 micrometers (μm), so laser annealing could be accomplished using such wavelengths.

In some embodiments, the laser anneal step can be carried out using a wavelength in the UV to mid-visible range. Such wavelengths can increase the amount of absorption by the plasmonic material (e.g., gold) and decrease the reflection of the laser energy. In some embodiments, lasers producing energy having a wavelength of not greater than 600 nm can be utilized. In some embodiments, the laser anneal step can be carried out using a laser producing energy having a wavelength of not greater than 550 nm, in some embodiments a wavelength of not greater than 530 nm, and in some embodiments, a wavelength of not greater than 360 nm. In some embodiments, lasers producing energy having a wavelength of not less than 100 nm can be utilized. In some embodiments, lasers producing energy having a wavelength of not less than 150 nm can be utilized. In some embodiments, lasers producing energy having a wavelength of not less than 190 nm can be utilized. In some embodiments, lasers producing energy having a wavelength of not less than 200 nm can be utilized. In some embodiments, lasers producing energy having a wavelength of not less than 300 nm can be utilized.

In some embodiments, shorter wavelengths may be preferred for higher absorption. Some specific illustrative wavelengths that can be utilized and the source thereof can include, for example Excimer lasers: 126 nm ($Ar_2$), 146 nm ($Kr_2$), 157 nm ($F_2$), 193 nm (ArF), 248 nm (KrF), 308 nm (XeCl), 351 nm (XeF), etc.; $CO_2$ lasers: 10 micron; and YAG lasers: 1064 nm, etc.

The laser anneal step can include one or multiple bursts of energy from the laser. Use of multiple bursts of energy from the laser can be used to create a temperature profile that will promote nucleation from a single nucleation front in order to favor the production of larger grains. One specific illustrative method for utilizing multiple bursts of energy could include the following multiple steps: the first burst of energy from a laser could have a wider wavelength range, which could serve to cause melting of the plasmonic material and rapid lateral solidification (RLS) and a second burst of energy from a laser (either the same or a different laser) could have a narrower wavelength range, which may be focused in the middle of the range of the first laser to prevent or minimize spontaneous nucleation at the middle of the melt zone in order to promote larger columnar grains from the nucleation fronts in the first beam. The two bursts of energy could be delivered simultaneously, or could be slightly offset in time from each other.

Some disclosed methods also include a step 130 of forming a peg. Generally, the peg can be formed from a film or layer of plasmonic material using various processing methods. In some embodiments, formation of the peg can be accomplished using one or more patterning processes, one or more milling processes, or some combination thereof. In some embodiments, forming the peg can be accomplished using patterning and milling for example.

Some disclosed methods also include a step 140 of forming a NFT. Generally, the NFT is formed from the peg (e.g., step 140 is accomplished after step 130). Generally, the NFT can be formed using various processes, including for example subtractive processes and patterning processes for example. Generally, the formation of a NFT can include deposition of a plasmonic material and one or more structural processing steps. Structural processing steps can include, for example milling at least a portion of the plasmonic material into a precursor of a NFT, and further material removal (e.g., polishing such as chemical mechanical polishing (CMP) for example), or combinations thereof.

Additional optional steps can also be utilized in disclosed methods. In some exemplary methods, additional annealing steps (either with or without the use of a laser), additional patterning steps, additional etching steps, or any combinations thereof can be carried out. In an exemplary method, a plasmonic material can be deposited, the plasmonic material can be laser annealed (at the wafer level), the plasmonic material can be thermally annealed (via an oven anneal, for example) at some temperature for some time, the material can then be cleaned, the plasmonic material can then be milled to a desired thickness, and then the peg can be formed. A more specific example of such an exemplary method could include, for example, depositing a plasmonic material (for example at least 100 nm), laser annealing the plasmonic material, oven annealing the plasmonic material at 225° C. for 3 hours, cleaning the material with an ECO-SNOW® clean ($CO_2$ cleaning), milling the cleaned plasmonic material down to a film of 25 nm, and then patterning the film into a peg having the desired dimensions.

In some embodiments where the laser annealing step is conducted at the sheet film stage, it may be followed, preceded by, or both, an additional laser anneal step (or steps). Additionally, in some embodiments, furnace anneal steps may also be included in such methods. Furthermore, before a peg is formed, the existing film of plasmonic material may be cleaned to remove particulates thereon. Furthermore, the thickness of the plasmonic material may be reduced to a more desirable thickness either prior to or after peg formation using various methods, including, for example milling, chemical mechanical polishing (CMP), etching (either wet or dry), or any combination thereof.

It should also be noted that laser annealing steps can be utilized at other intermediary steps in the formation of a NFT, after formation of the peg. For example, laser annealing can be utilized during formation of a disc of the NFT, a heat sink of the NFT, or both. Such embodiments of disclosed methods can afford NFTs in which various elements (peg, disc, heat sink, or some combination) are advantageously made of grain reduced plasmonic material. Laser annealing can also be carried out after the patterned NFT device is partially or completely covered by an encapsulant metal or dielectric layer.

In some embodiments, laser annealing the plasmonic material (at any stage) without further considerations or processes can have a detrimental effect on structures or materials at other regions of the wafer, for example located beneath the plasmonic material. In some embodiments, particular characteristics of the laser anneal can be further characterized or specified in order to avoid detrimental effects, to proffer advantageous results, or some combination thereof. In some embodiments, particular characteristics of the material to be laser annealed can be further characterized or specified in order to avoid detrimental effects, to proffer advantageous results, or some combination thereof.

In some embodiments, disclosed methods can include steps of depositing plasmonic material, laser annealing at least a portion of the deposited plasmonic material to form an epitaxially modified plasmonic material and forming a NFT or other device from at least a portion of the epitaxially modified plasmonic material.

In some embodiments, disclosed methods can include a localized LPE inducing laser anneal step on a film deposited over an area larger than necessary for the desired structure (e.g., a blanket film). The desired device or structure can then be constructed from the annealed area to obtain a device or structure made from a single or multiple material grains. The material surrounding the final device or structure can then be removed after fabrication of the device or structure is completed. In some embodiments, the step of laser annealing can include more than one pulse of energy from the laser, e.g., more than one laser anneal pulse.

Methods disclosed herein can also include steps of patterning plasmonic material into a structure that is larger than a final desired size of the NFT, laser annealing the pre-patterned structure, and then forming a final NFT structure from the pre-patterned structure. In FIG. 4, this could be represented by step 110, followed by pre-patterning the plasmonic material, followed by step 120, followed by step 130, and then subsequently step 140.

In some embodiments, a patterned structure or material, which can be referred to herein as a seed material can be utilized in order to control grain orientation of the epitaxially modified plasmonic material, position of the epitaxially modified plasmonic material, or a combination thereof. A seed material can be useful to control the grain pattern, the location (e.g., a seed pattern), or a combination thereof. A pattern structure or mold could be part of the final device or structure or could be sacrificial (removed before the final device or structure is complete). The patterned structure or mold material can be selected from a material that may be appropriate to "seed" an epitaxially modified plasmonic material with desired grain structure, in desired areas only, or a combination thereof. In some embodiments, more than one seed material or seed pattern can be utilized. In some embodiments, the step of laser annealing can include more than one pulse of energy from the laser, e.g., more than one laser anneal pulse in combination with one or more than one seed material, pattern or both.

Illustrative seed material can include, for example high melting temperature metals, high melting temperature ceramics, or combinations thereof. The solubility of the mold material in the plasmonic material can also be considered when determining an appropriate seed material. In some embodiments, the seed material (or mold material) can be a material with (a) sufficiently higher melting temperature than the plasmonic layer being annealed; (b) appropriately limited solubility; (c) ability to be removed post-processing from the final device if it is not compatible with form, fit or function of the device, or some combination thereof. In some embodiments, useful seed materials can include, but are not limited to refractory metals, high-melting temperature materials, or combinations thereof. Illustrative specific materials can include, for example, tungsten (W), tantalum (Ta), titanium (Ti), platinum (Pt), palladium (Pd), ruthenium (Ru), iridium (Ir), carbon (C), alumina ($Al_2O_3$), sapphire, or combinations thereof. In some embodiments, high-melting temperature oxides, high-melting temperature nitrides, high-melting temperature carbides, or high-melting temperature borides could also be utilized. In some embodiments, carbon such as amorphous carbon (aC) or diamond can be utilized. It should also be understood that any combinations of any of the given elements or materials could also be utilized.

In some embodiments, a patterned seed material, or seed pattern for example, can be configured to provide topographical features (trenches, pits, peaks, etc.) to the epitaxially modified plasmonic material after laser annealing. In such embodiments, the seed pattern itself can have a reverse of the desired pattern, or can have a desired pattern embedded into the seed pattern. In some embodiments, topographical features can be useful to facilitate the start of material solidification, recrystallization, or both from the liquid phase of the plasmonic material. For example, freestanding rods, pillars or similar features can be utilized to initiate solidification, recrystallization, or both. The location of the topographical within the seed pattern can be chosen to disfavor spontaneous or random nucleation at the edges of the melt area and instead favor a controlled location of nucleation. In some embodiments, this can be accomplished by placing the topographical features in the interior of the patterned area versus around the perimeter. This can serve to improve predictability of forming grains at specific or desired locations. Controlling nucleation sites can be advantageous in methods where device fabrication from a single (or minimal number) of grains is desired.

In some embodiments, features can be added to control the nucleation points of solidification along the edge of the melt zone of the plasmonic material. Without particular patterning, long melted edges can be formed where solidification first happens randomly at favorably-oriented crystallites in a non-melted region. Because of the random in-plane orientation of the unmelted area, this can produce a statistically average resolidified grain size along the edge that is smaller than the length of the resolidified grains normal to this edge (e.g., ~250 nm lateral grain size parallel to the edge and ~2 µm grain size normal to the edge).

In some preferred embodiments, grain sizes that are 2 µm×2 µm, or larger would be useful to accommodate "normal" NFT feature dimensions. In some embodiments, such larger grain sizes can be accomplished by providing points of resolidification sparser along the melted edge. This "behavior" can be accomplished in multiple ways. One method of creating this phenomenon is to create a starting unmelted microstructure of the material to be annealed that is not random in-plane. This could be accomplished by using, for example, tilted deposition without rotation combined with deposit/etch/deposit approaches using unique in-plane etch angles. Another way of accomplishing it would be to create a starting unmelted microstructure of the material to be annealed that has a larger starting grain size distribution. This could be accomplished by using post-deposition global thermal annealing or non-melting laser pre-pulse to grow grains prior to melting.

Figure 5:
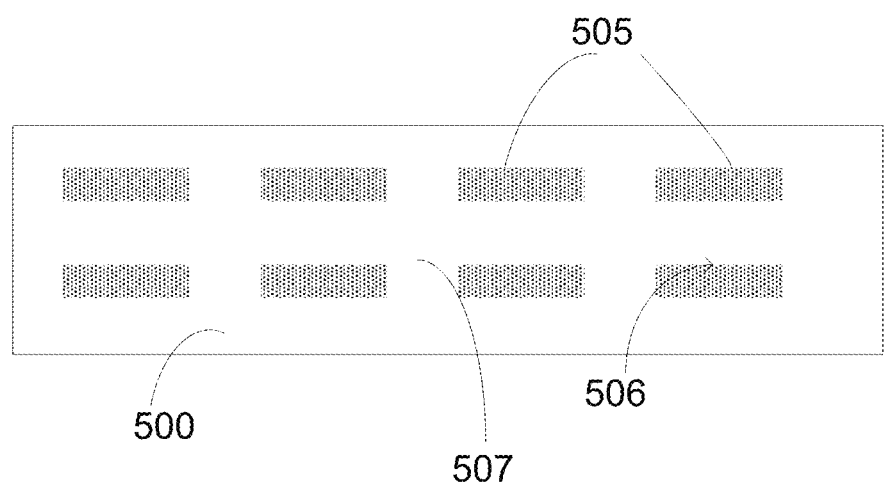
FIG. 5 show illustrative features that could be utilized to direct resolidification and crystallization.

Yet another way of forcing resolidification to be less favorable along the melted edge would be to introduce features that inhibit solidification. For example, edges could be patterned to have periodic access to unmelted metals but the dielectrics could be elsewhere. FIG. 5 shows an example of features that could be utilized to direct resolidification and crystallization. The solidification inhibition features 505 can be formed on the substrate 500 before the plasmonic material is deposited. The solidification inhibition features 505 function to make recrystallization or solidification of the plasmonic material along their face 506 much less favorable than in the recrystallization spaces 507 between them. The solidification inhibition features 505 have a size and spacing from each other that allows for the desired crystal size in the recrystallization spaces 507. In some embodiments, the space between the solidification inhibition features 505 has a size that is at least the size of the desired grain size for formation of a NFT. In some embodiments, the space between the solidification inhibition features 505 has a size that is larger than the desired grain size for formation of a NFT. In some embodiments, the space between the solidification inhibition features 505 is at least 2 µm.

Control of the thermal gradients involved during the liquid phase epitaxy step can also be gained by utilizing patterned structures (e.g., damascene like). Normal LPE with projection of the laser through a rectangular mask aperture causes freezing to happen with symmetrical-in-plane thermal gradients. Control of the in-plane and vertical temperature profiles can be used to modify the freezing profile. The in-plane gradients can be modified using asymmetric structures (also referred to as a mold) to control the heat flow during the refreeze in one or more directions asymmetrically. The materials of the mold can be selected to "seed" the material recrystallization, in order to control grain orientation and position. The mold could be either permanent (e.g., part of the final device) or sacrificial. The final microstructure may be produced from a single or multiple pulses, sequential or overlapping pulses, or any combination thereof.

Illustrative mold materials may include suitable high melting temperature metals or ceramics with appropriate solubilities in the annealed materials. Mold materials can include, oxides, nitrides, carbides, borides, and combinations thereof for example. Mold materials can include specifically, for example, tungsten (W), tantalum (Ta), carbon (C) (e.g., amorphous carbon, or diamond), alumina, sapphire, or combinations thereof. The physical shape of the mold can be utilized to control grain orientation and position (as the annealed material solidifies from the melt). In some embodiments, the patterned structure could include dedicated topographical features (including trenches, pits, etc.) formed in a specific pattern within, embedded, or combinations thereof in the mold in order to further facilitate the start of material solidification/recrystallization. Solidification/recrystallization from the melt is initiated at freestanding rods, pillars, or other patterns in the mold (vs. spontaneous/random nucleation at the edges of the melt to improve predictability in the specific location of the grain formation).

In some embodiments, defects that get formed in the melt as it solidifies can be minimized by the application of ambient heat. In some embodiments, heat may be applied to a wafer containing the surface or substrate upon which the plasmonic material was deposited and the portion is being annealed. In some embodiments, heat may be applied to a wafer via an embedded heater. In some embodiments, an embedded heater may be located underneath the location where the plasmonic material was deposited or more specifically where the portion is being annealed. In some embodiments, heat may be applied to a wafer via a second laser (e.g., separate from the LPE laser anneal laser source). In some embodiments, the heat can be applied after an initial pulse from the LPE laser anneal laser source. In some embodiments, the heat can be applied during a time when the melt is solidifying.

In some embodiments, more than the plasmonic material can be deposited. Any method of delivering a dopant material to a plasmonic material can be utilized. For example, a multi-layer of dopant material and plasmonic material, including bilayers with either the dopant or plasmonic material at either the top or the bottom for example can be utilized; patterned dopants can be located within the plasmonic matrix (where the dopant-plasmonic material connects laterally); the dopant and plasmonic materials can both be deposited at the same time through e.g., co-sputtering, sputtering from a composite target, etc. For example, an alloying element, dopant, or a combination thereof can be deposited. In some embodiments, a second material can be deposited substantially coincident with the plasmonic material, before the plasmonic material, after the plasmonic material, or some combination thereof. In some embodiments, a second material can be deposited as a relatively thin, "dusting" layer. This layer of the second material can be deposited below the plasmonic material, within the plasmonic material, outside the plasmonic material, or any combination thereof. During a subsequent LPE laser anneal step, the dopant(s) will be dispersed during the melting of the plasmonic material. As such, this can achieve a microstructure where the dopant is at least somewhat substantially homogenously distributed throughout the melt, thereby achieving a desired microstructure modification/stabilization by the dopant(s).

In some embodiments, a material can be implanted into the plasmonic material, thereby seeding the plasmonic material with a desired, controlled dopant concentration. During a subsequent LPE laser anneal step, the dopant(s) will be dispersed during the melting of the plasmonic material. As such, this can achieve a microstructure where the dopant is at least somewhat substantially homogenously distributed throughout the melt, thereby achieving a desired microstructure modification/stabilization by the dopant(s).

In some embodiments, materials can be added as a dopant to a plasmonic material by applying a relatively thin layer in proximity to the plasmonic material prior to the laser anneal step. The relatively thin layer, which could even be referred to as a "dusting layer". In some embodiments, the dusting layer could be so thin that it is discontinuous. In some embodiments, the dusting layer could have a thickness that is not greater than 2 nm, or even not greater than 0.5 nm. The dusting layer can be located below the plasmonic material, above the plasmonic material, or could have even been deposited during deposition of the plasmonic material which would have it located within the plasmonic material before annealing. During a subsequent LPE laser anneal, the dopant will be dispersed (intermixed, reacted with, or combinations thereof) in the film to achieve a desired microstructure modification/stabilization.

In some embodiments, the ambient atmosphere may be modified during the laser annealing step. For example, the laser anneal step can be carried out in an environment that is tailored to obtain particular properties in the laser annealed material. For example, the plasmonic material can be laser annealed in a reactive environment. In some embodiments, the general idea is to cause the dopant to react with a gas in the environment to form the desired form of the dopant in the plasmonic material. For example, $O_2$, $O_3$, or air can be utilized in combination with a dopant to form an oxide, $N_2$, or air can be utilized to form a nitride, Boron can be utilized in combination with a dopant to form a boride, or a carbon containing gas can be utilized in combination with a dopant to form a carbide, etc. In some embodiments, additional gases including for example oxygen ($O_2$), hydrogen ($H_2$), or others, may be added to the atmosphere in which the process wafer is located. Controlling the atmosphere in such a way can be referred to as creating a reactive melt. An example of a particular embodiment where the atmosphere may be controlled can include the addition of oxygen ($O_2$) when the plasmonic material includes gold (Au) and yttrium (Y) was also deposited as a dopant. Such a configuration, once laser annealed, can produce a gold film with yttrium oxide (YO), for example in the form of nanoparticles, dispersed at the grain boundaries, inside Au grains and surface of the gold. YO at the grain boundaries, inside Au grains and surfaces may function advantageously to stabilize the gold microstructure.

Some embodiments can include plasmonic layers over patterned, higher-melting temperature layers that can crystallographically influence the structure of the melted plasmonic layer disposed thereon. For instance, a continuous, discontinuous or combination thereof seed layer can be disposed under a plasmonic layer to influence the crystallographic properties of an annealed plasmonic layer disposed thereon. In some embodiments, the underlying material can be amorphous, or more generally, a non-lattice matched surface. In some embodiments, the underlying material can include metal materials, dielectric materials, semiconductor materials, crystalline materials, or any combinations thereof. Alternatively, plasmonic materials disposed on patterned, higher-melting temperature layers can be utilized to crystallographically influence the structure of the melted layer above. In some specific embodiments, a rhodium (Rh) or iridium (Ir) layer can be deposited on an underlayer of crystalline gold in a specific pattern or otherwise.

Some embodiments can include a material layer that has a layer formed thereon, e.g., a cap layer. In some embodiments, the cap layer can be transparent (e.g., dielectric $SiO_2$ that can survive the laser anneal but can be selectively etched off sometime after annealing). A cap layer can function to maintain the thickness of the plasmonic material. The cap layer can also be utilized to manipulate the surface energy of the plasmonic material to change the crystalline plane during recrystallization or solidification. The cap layer can be maintained in the final structure or can be sacrificial.

In some embodiments, a two step process can be utilized to template the plasmonic material from columnar grains created in a previous laser anneal. For example, a first step can include a multi shot (e.g., two shots) laser anneal to generate large columnar grains and then a second step can be begun by rotating the wafer by 90° and the repeat the multi shot (e.g., two shots) laser anneal to promote even larger grains using the large column grains formed in the first step as a template. Alternatively, the rotation can be other than 90°, which may induce preferential growth of certain orientations if the first melted microstructure is textured. It should also be noted that any of the above discussed laser anneals can include more than one shot or pulse of one or more lasers.

In some embodiments, grain orientation control can be utilized with or without an oxide capping layer. Columnar grains formed using rapid lateral solidification (RLS) are likely to have preferred orientations due to kinetic and thermodynamic anisotropies so the presence or lack of a cap layer can affect the material differently. With a cap layer, (100) crystalline material may be preferred in the growth direction. Without a cap layer, (110) crystalline material may be preferred in the growth direction to maintain a (111) out-of-plane texture for minimizing the system energy with an open surface.

FIGS. 6A, 6B and 6C depict, schematically, the effect of more than one shot or pulse from a laser. In FIGS. 6A, 6B and 6C the laser has the same laser opening width 650 for each shot. The first shot, 610, has the laser positioned so that the material within the dashed area is melted and solidified upon cooling. The laser can then be re-positioned for the second shot 620, which again melts the material within the dashed area is melted and then solidifies upon cooling. The laser can again be re-positioned for a third shot 630, which again melts the material within the dashed area and then solidifies upon cooling. The laser can then again be re-positioned before a fourth shot 640, thereby melting the material in the dashed area before solidifying upon cooling.

FIG. 6B shows a schematic illustration of the lateral growth direction (towards the center) and the nucleation zone (in the middle of the dashed area) which can be caused by each pulse or shot of the laser. FIG. 6C shows a single shot 660 with a mask 665 and the resultant primary grain boundary 690 and lateral growth and sub-grain boundary 695 caused thereby. In step 670, the mask 665 is moved and a second shot or pulse of a laser causes another primary grain boundary (as seen at image 680) 691 to be formed.

Figure 9C:
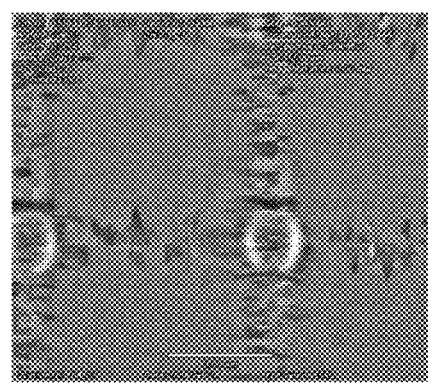
Figure 7:
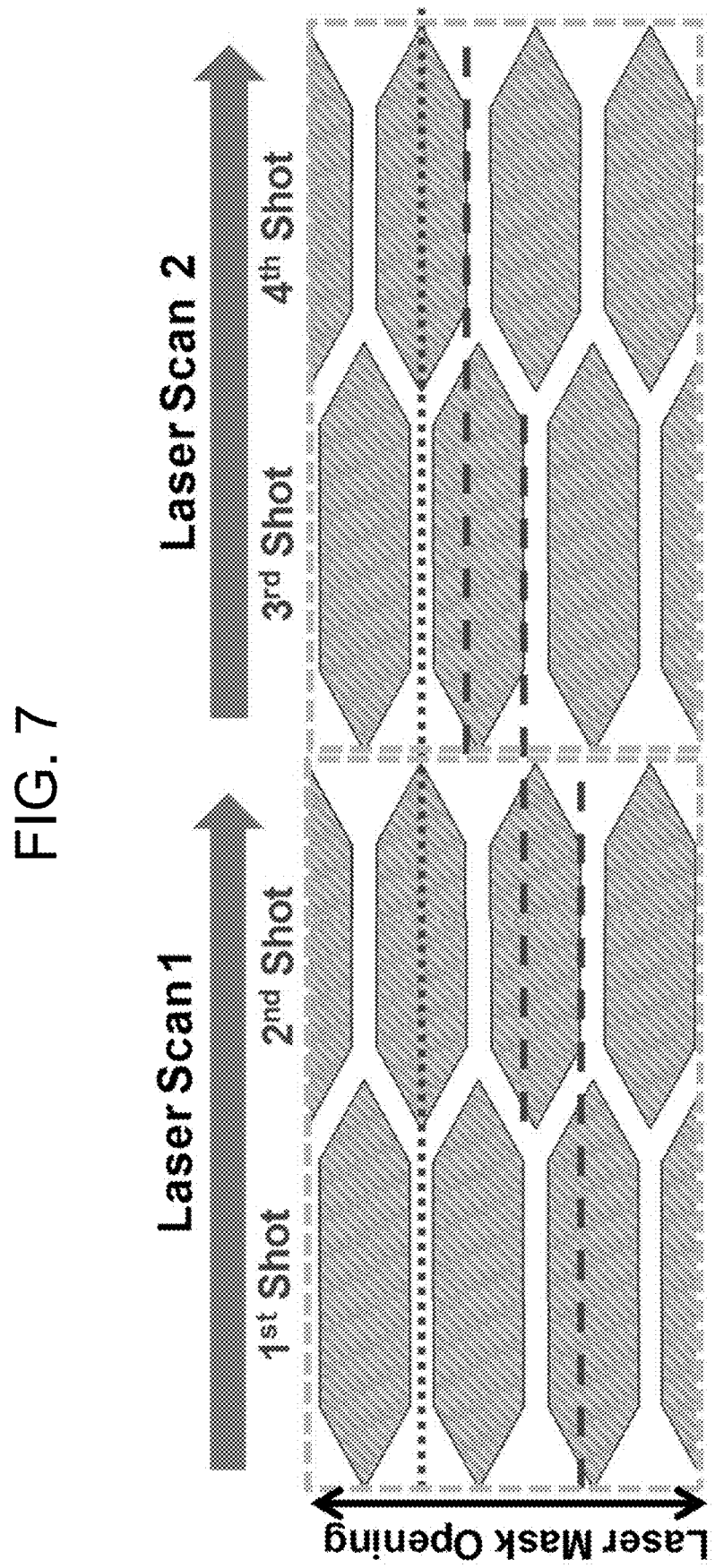
FIG. 7 schematically depict the effect of four laser shots in two scans.
Figure 8:
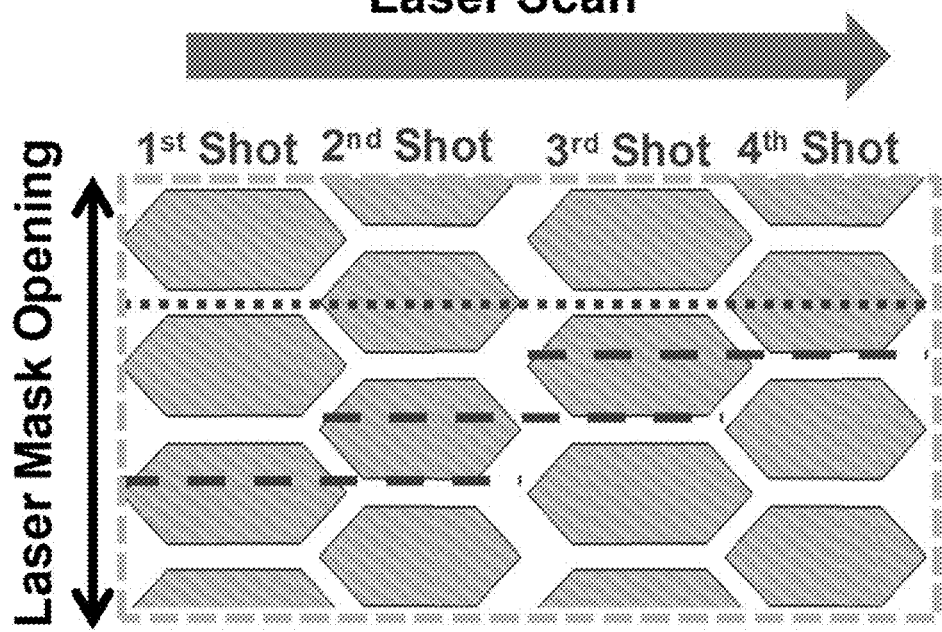
FIG. 8 schematically depict the effect of four laser shots in one scan.
Figure 9A:
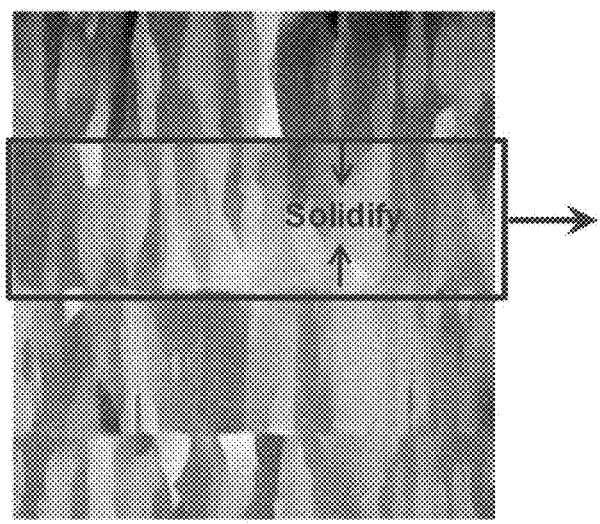
Figure 9B:
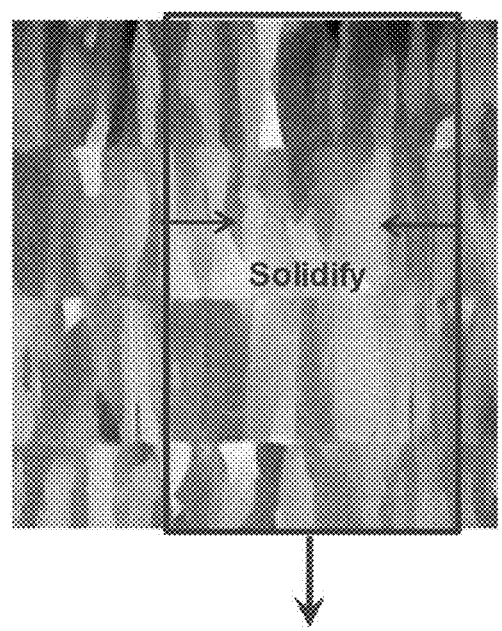
Figure 9D:
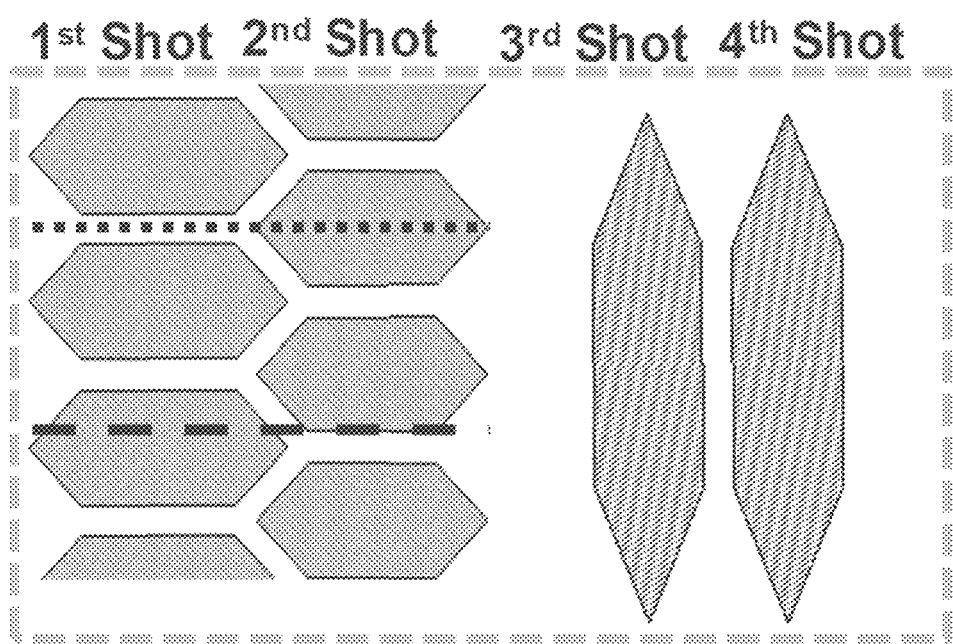
FIG. 9D shows schematically the effect of four orthogonal laser shots in one scan.

FIG. 7 shows the results from a four shot, two scan sequence. grain growth after a first shot. FIG. 8 shows the results after a four shot in one scan pulse. FIGS. 9A and 9B show the results of a first horizontal scan followed by a second vertical scan. In FIG. 9A, the first horizontal scan results in LPE templating from unmelted grains and creates columnar grain structures after recrystallization. In FIG. 9B, the subsequent vertical scan shows LPE templating from the side of the columnar grains formed in the first can and may enable much bigger grain widths upon recrystallization. In some embodiments, a scanning mode may be preferred, rather than a static mode because it has multiple solidification fronts from the boundary of the laser spot. FIG. 9C shows the results of a static laser shot with four exposures with orthogonal openings. FIG. 9D schematically illustrates orthogonal laser shots from one scan.

To reduce splintering and thus increase grain width, the film thickness may be increased and the laser energy may be decreased. To reduce stacking fault defects, the film thickness may be increased and the laser energy may also be increased. Larger single-crystalline regions in the material can be promoted by minimizing solidification fronts with laser melt zones with larger aspect ratios.

It should also be understood that the methods depicted herein can be utilized with other devices and structures other than NFTs for example. In some embodiments the methods could be applicable to wafer level laser annealing of any device structures, including, for example reader and writer elements. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of forming a near field transducer (NFT), the method comprising the steps of:
   forming a mold on a substrate, the mold comprising tungsten (W), tantalum (Ta), titanium (Ti), platinum (Pt), palladium (Pd), ruthenium (Ru), iridium (Ir), carbon (C), oxides, nitrides, carbides, or borides, combinations thereof;
   depositing a plasmonic material on at least a portion of the mold;
   laser annealing at least a portion of the deposited plasmonic material to induce liquid phase epitaxy (LPE) in the annealed deposited plasmonic material to form a epitaxially modified plasmonic material, wherein the mold controls at least the in-plane gradient in the plasmonic material and the mold comprises trenches, pits, rods, pillars, or combinations thereof; and
   forming a NFT from at least a portion of the epitaxially modified plasmonic material.

2. The method of claim 1, wherein the mold comprises tungsten (W), tantalum (Ta), titanium (Ti), platinum (Pt), palladium (Pd), ruthenium (Ru), iridium (Ir), carbon (C), or combinations thereof.

3. The method of claim 1, wherein the mold is an amorphous material.

4. The method of claim 1, wherein the mold is a crystalline material.

5. The method of claim 1 further comprising pre-patterning the plasmonic material before laser annealing.

6. The method of claim 1 further comprising forming a capping layer on the plasmonic material before laser annealing the plasmonic material.

7. The method of claim 6 further comprising removing the capping layer after laser annealing the plasmonic material.

* * * * *